United States Patent
Kwon et al.

(10) Patent No.: US 7,982,395 B2
(45) Date of Patent: Jul. 19, 2011

(54) ORGANIC LIGHT EMITTING DISPLAY DEVICE

(75) Inventors: Ae-Kyung Kwon, Yongin (KR); Se-Ho Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 142 days.

(21) Appl. No.: 12/468,651

(22) Filed: May 19, 2009

(65) Prior Publication Data

US 2009/0315459 A1    Dec. 24, 2009

(30) Foreign Application Priority Data

Jun. 18, 2008    (KR) .......................... 10-2008-0057251

(51) Int. Cl.
*H05B 33/00* (2006.01)
*H01J 1/54* (2006.01)

(52) U.S. Cl. ..................... 313/505; 313/331; 315/169.3; 345/76

(58) Field of Classification Search ........................ None
See application file for complete search history.

(56) References Cited

U.S. PATENT DOCUMENTS

| 7,724,247 | B2 * | 5/2010 | Yamazaki et al. | 345/207 |
| 7,746,417 | B2 * | 6/2010 | Lim et al. | 349/40 |
| 2006/0044237 | A1 * | 3/2006 | Lee et al. | 345/82 |
| 2006/0061524 | A1 * | 3/2006 | Suh et al. | 345/76 |
| 2006/0077144 | A1 * | 4/2006 | Eom et al. | 345/82 |
| 2006/0244741 | A1 * | 11/2006 | Kimura et al. | 345/204 |

FOREIGN PATENT DOCUMENTS

| KR | 10-0293982 | * | 4/2001 |
| KR | 10-2006-0032427 | | 4/2006 |
| KR | 10-2006-0064960 | | 6/2006 |
| KR | 10-2007-0011179 | | 1/2007 |

OTHER PUBLICATIONS

Korean Patent Abstract, Publication No. 1020000012919, dated Mar. 6, 2000, corresponding to KR 10-0293982 listed above.

* cited by examiner

*Primary Examiner* — Ashok Patel

(74) *Attorney, Agent, or Firm* — Christie, Parker & Hale, LLP

(57) ABSTRACT

An organic light emitting display device includes a display panel provided with a pad region having a plurality of pads. A flexible circuit board having lead terminals is coupled into the pad region. The pad region includes a plurality of first pads electrically coupled to the flexible circuit board through the lead terminals and a plurality of second pads electrically isolated from the flexible circuit board.

4 Claims, 2 Drawing Sheets

ORGANIC LIGHT EMITTING DISPLAY DEVICE

CROSS-REFERENCE TO RELATED APPLICATIONS

This application claims priority to and the benefit of Korean Patent Application No. 10-2008-0057251, filed on Jun. 18, 2008, in the Korean Intellectual Property Office, the entire content of which is incorporated herein by reference.

BACKGROUND OF THE INVENTION

1. Field of the Invention

The present invention relates to display panels, and more particularly, to an organic light emitting display device having a reduced size flexible circuit board for driving a display panel.

2. Description of Related Art

Recently, there have been developed various types of flat panel display devices having lighter weight and smaller volume than cathode ray tubes. Among the flat panel display devices, an organic light emitting display device has emerged as a leader because of the excellent luminance and color purity provided by an organic compound used as a light emitting material.

Generally, an organic light emitting display device includes a display panel provided with at least a pixel device, and a flexible circuit board supplying driving signals to the display panel. The flexible circuit board is electrically coupled to the display panel through a compression process using an anisotropic conductive film (ACF) in a module manufacturing process.

In such an organic light emitting display device, in order to enhance the efficiency of the module manufacturing process and to decrease manufacturing cost, the flexible circuit board needs to be structured so as not to be unnecessarily large in size.

SUMMARY OF THE INVENTION

In accordance with the present invention an organic light emitting display device is provided in which the size of a flexible circuit board is reduced.

According to an exemplary embodiment of the present invention, an organic light emitting display device includes a display panel provided with a pad region having a plurality of pads. A flexible circuit board has lead terminals coupled into the pad region. The pad region includes a plurality of first pads electrically coupled to the flexible circuit board through the lead terminals, and a plurality of second pads electrically isolated from the flexible circuit board.

The first pads are driving pads receiving electric power and control signals for driving the display panel when the display panel is operationally driven. The display panel includes a pixel device having a plurality of pixels and a driving circuit supplying a driving signal to the pixel device. The first pads include a plurality of pads supplying the electric power and control signals to the pixel device and the driving circuit.

The second pads are test pads coupleable to a flexible circuit board for testing which supplies test signals to the display panel when the display panel is tested. The second pads are electrically isolated from external component other than components of the display panel.

As described above, in accordance with the present invention a flexible circuit board is designed so that lead terminals of the flexible circuit board used in driving of a display panel includes only lead terminals providing electric power and signals required when the display panel is operationally driven. As such, the size of the flexible circuit board becomes reduced, such that the portability and storage convenience of the organic light emitting display device is improved. Further, the cost of components is reduced, and its module manufacturing process is simplified, thereby decreasing a defect rate.

DETAILED DESCRIPTION

Figure 1:
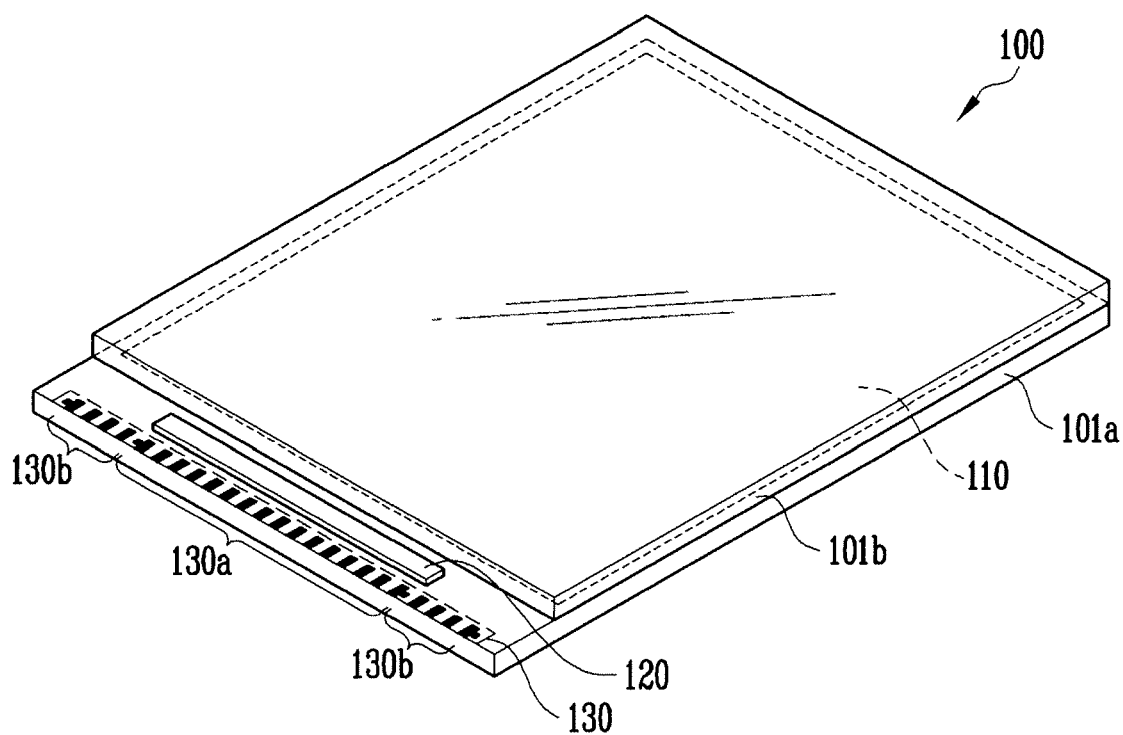
FIG. 1 is a perspective view showing a display panel of an organic light emitting display device according to an embodiment of the present invention.

Hereinbelow, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Like reference numerals refer to like elements.

Referring to FIG. 1, the display panel 100 of the organic light emitting display panel according to the embodiment of the present invention includes a pixel device 110 provided in a sealed region between first and second substrates 101a, 101b, a driving circuit 120 supplying a driving signal to the pixel device 110, and a pad region 130 having a plurality of pads providing electric power and signals to the pixel device 110 and/or the driving circuit 120.

The pixel device 110 includes a plurality of pixels (not shown) formed on the first substrate 101a. Each of the pixels includes at least an organic light emitting diode and emits light having a luminance corresponding to a driving signal supplied from the driving circuit 120.

The driving circuit 120 may be mounted in the form of an integrated circuit (IC) chip on the first substrate 101a, or at least a portion of the driving circuit 120 may be formed on the first substrate 101a together with the pixel device 110. When the display panel 100 is driven, the driving circuit 120 supplies driving signals (e.g., scan signals, data signals, and the like) to the pixel device 110.

The pad region 130 includes a plurality of first pads 130a receiving electric power and control signals supplied from a flexible circuit board for driving when the display panel 100 is driven, and a plurality of second pads 130b receiving test signals supplied from the flexible circuit board for testing for display panel 100 defects.

That is, the first pads 130a are driving pads which are used when the display panel 100 is driven, and the second pads 130b are test pads which are used when a testing process for the display panel 100 is performed. Here, the first and second pads 130a, 130b are coupled to the pixel device 110 and/or the driving circuit 120 through wires (not shown) in the display panel 100 to provide electric power and/or signals to the pixel device 110 and/or the driving circuit 120.

For example, the first pads 130a may include power pads and signal pads, the power pads respectively receiving electric power, such as first and second pixel voltage sources ELVDD, ELVSS and first and second driving voltage sources VDD, VSS, for the pixel device 110 and the driving circuit 120 when the display panel 100 is operationally driven, and the signal pads receiving control signals for the driving circuit 120, such as start pulses and clock signals.

The second pads 130b may include test pads receiving test signals when, for example, a simple lighting test of the display panel 100 is performed.

The second pads 130b are used only in a test of the display panel 100 and are not used when the display panel 100 is driven after it has been tested.

As can be seen in FIG. 1, the first pads 130a are disposed at a central portion of the pad region 130, and the second pads 130b are divided and situated at both sides of the pad region 130. However, only an exemplary embodiment of the configuration of the pad region 130 is shown in FIG. 1, and the configuration of the pad region 130 may be structured in other ways.

An align key for the facilitation of alignment of a flexible circuit board or the like may be formed at a boundary between the first and second pads 130a, 130b.

Figure 2:
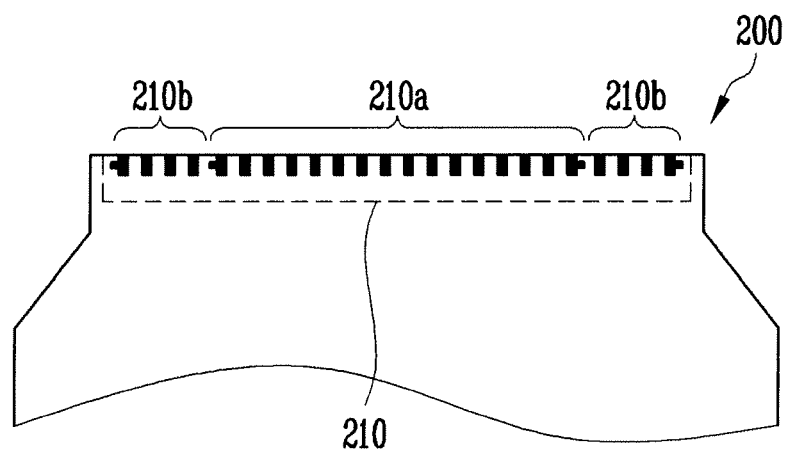
FIG. 2 is a plan view showing an illustrative example of lead terminals provided on a flexible circuit board which supplies test signals to the display panel shown in FIG. 1.

FIG. 2 is a plan view showing an illustrative example of lead terminals on a flexible circuit board which supplies test signals to the display panel shown in FIG. 1. For convenience of illustration, one surface (i.e., one surface facing the display panel) of the flexible circuit board for testing, on which the lead terminals are formed, will be schematically shown in FIG. 2.

Hereinafter, the configuration of lead terminals on the flexible circuit board for testing will be described in more detail in conjunction with FIGS. 1 and 2.

The flexible circuit board 200 for testing includes lead terminals 210 for connection to the pad region 130 of the display panel 100. Here, the lead terminals 210 include first lead terminals 210a alignable with and connectable to the first pads 130a, and second lead terminals 210b alignable with and connectable to the second pads 130b.

However, a test may be performed in the state that the driving circuit 120 is not mounted in the display panel 100. Since the first lead terminals 210a are not operationally used in the testing, they may be replaced by align keys or the like.

The second lead terminal 210b are aligned with the second pads 130b and then coupled electrically to the second pads 130b, so that a test signal supplied via the flexible circuit board 200 for testing from an external system (e.g., a computer) is provided to the display panel 100.

To this end, the lead terminals 210 of the flexible circuit board 200 for testing are aligned with the pad region 130 of the display panel 100 when a test is performed. The second lead terminals 210b are electrically coupled to the second pads 130b by a physical force applied from the outside, so that a test signal is supplied to the display panel 100.

Figure 3:
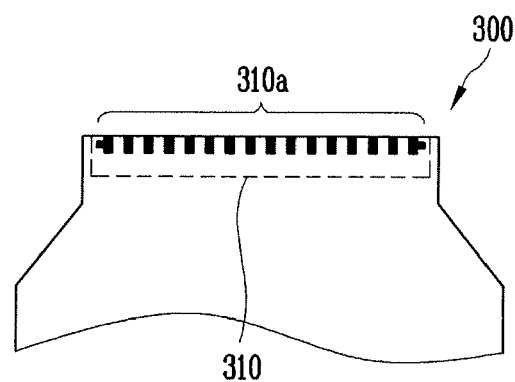
FIG. 3 is a plan view showing an illustrative example of lead terminals provided on a flexible circuit board which supplies driving signals to the display panel shown in FIG. 1.

FIG. 3 is a plan view showing an illustrative example of lead terminals provided to a flexible circuit board for driving, which supplies driving signals to the display panel shown in FIG. 1. For convenience for illustration, one surface (i.e., one surface facing the display panel) of the flexible circuit board for driving, on which the lead terminals are formed, is schematically shown in FIG. 3.

Hereinafter, the configuration of the lead terminals provided on the flexible circuit board for driving will be described in more detail in conjunction with FIGS. 1 and 3.

The flexible circuit board 300 for driving includes lead terminals 310 connectable to pads in the pad region 130 of the display panel 100. Particularly, the lead terminals 310 of the flexible circuit board 300 have lead terminals 310a alignable with and connectable to the first pads 130a, but without lead terminals alignable with the second pads 130b.

The respective lead terminals 310a are electrically coupled to the first pads 130a through a compression process using an anisotropic conductive film (ACF) or the like, so that the flexible circuit board 300 for driving is electrically coupled to the display panel 100.

As described above, the flexible circuit board 300 for driving is economically designed to include only the lead terminals 310a providing electric power and signals needed when the display panel 100 is driven after being tested. Accordingly, the size of a flexible circuit board (i.e., the flexible circuit board 300) provided to an organic light emitting display device delivered as a product is reduced, so that the portability and storage convenience of the organic light emitting display device can be improved. Further, the cost of components can be saved, and a module process is simplified, thereby decreasing a defect rate.

Figure 4:
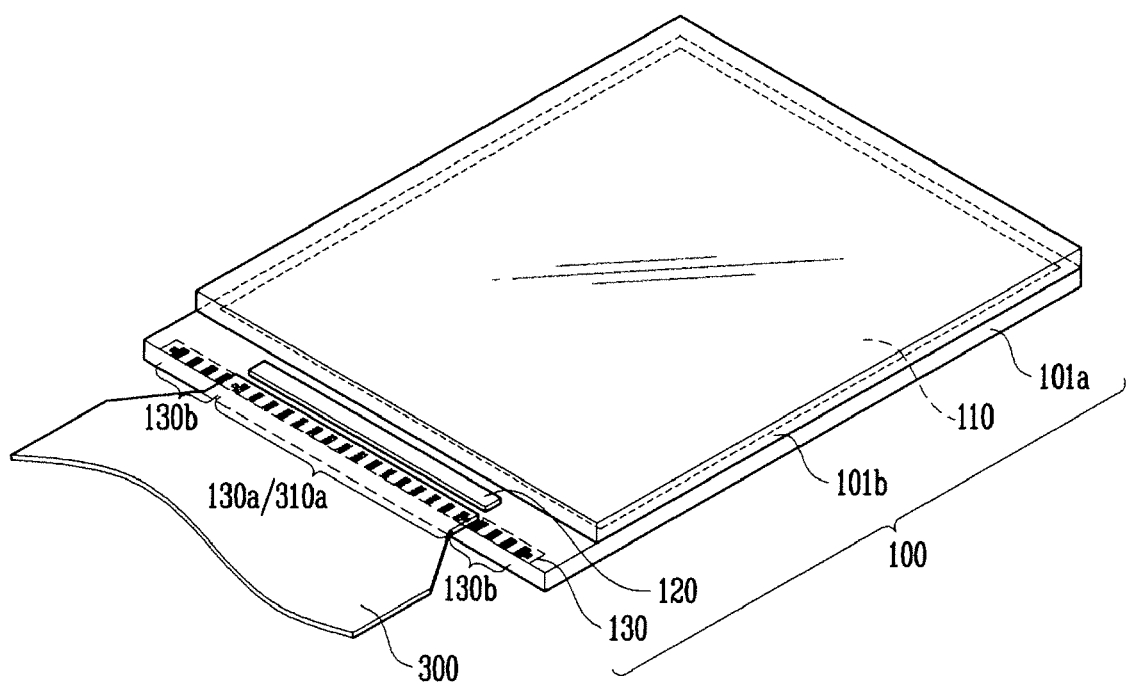
FIG. 4 is an assembled perspective view of the display panel and the flexible circuit board for driving shown in FIGS. 1 and 3, respectively.

FIG. 4 is an assembled perspective view of the display panel and the flexible circuit board for driving shown in FIGS. 1 and 3 respectively.

Referring to FIG. 4, the lead terminals 310a of the flexible circuit board 300 for driving are aligned with the first pads 130a of the display panel 100 and then coupled electrically to the first pads 130a of the display panel 100. Therefore, the flexible circuit board 300 is electrically coupled to the display panel 100.

The second pads 130b of the display panel 100 are electrically insulated from the flexible circuit board 300 for driving, and electrically isolated from an external component except components (e.g., the pixel device 110 and the driving circuit 120) of the display panel 100. A protection film (not shown) or the like, which is used to secure stability of the display panel 100, may be provided on the second pads 130b.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
a display panel having a pad region; and
a flexible circuit board having lead terminals coupled into the pad region,
wherein the pad region comprises a plurality of first pads electrically coupled to the flexible circuit board through the lead terminals and a plurality of second pads electrically isolated from the flexible circuit board, and
wherein the first pads comprise driving pads for receiving electric power and control signals for driving the display panel from the flexible circuit board.

2. The organic light emitting display device as claimed in claim 1, wherein the second pads are electrically isolated from an external component other than components of the display panel.

3. The organic light emitting display device as claimed in claim 1, wherein the display panel comprises a pixel device having a plurality of pixels, and a driving circuit supplying a driving signal to the pixel device, and wherein the first pads supply the electric power and control signals to the pixel device and to the driving circuit.

4. The organic light emitting display device as claimed in claim 1, wherein the second pads are test pads for receiving test signals when the display panel is tested.

* * * * *